United States Patent
Haukka et al.

(10) Patent No.: US 8,592,294 B2
(45) Date of Patent: Nov. 26, 2013

(54) HIGH TEMPERATURE ATOMIC LAYER DEPOSITION OF DIELECTRIC OXIDES

(75) Inventors: Suvi Haukka, Helsinki (FI); Hannu Huotari, Espoo (FI); Marko Tuominen, Helsinki (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 12/710,185

(22) Filed: Feb. 22, 2010

(65) Prior Publication Data
US 2011/0207283 A1 Aug. 25, 2011

(51) Int. Cl.
H01L 21/20 (2006.01)

(52) U.S. Cl.
USPC .......................................... 438/584

(58) Field of Classification Search
None
See application file for complete search history.

(56) References Cited

U.S. PATENT DOCUMENTS

| | | |
|---|---|---|
| 4,199,773 A | 4/1980 | Goodman et al. |
| 4,935,382 A | 6/1990 | Johnston, Jr. et al. |
| 5,037,774 A | 8/1991 | Yamawaki et al. |
| 5,159,413 A | 10/1992 | Calviello et al. |
| 5,256,550 A | 10/1993 | Laderman et al. |
| 5,310,696 A | 5/1994 | McCann et al. |
| 5,393,352 A | 2/1995 | Summerfelt |
| 5,478,653 A | 12/1995 | Guenzer |
| 6,140,209 A | 10/2000 | Iwane et al. |
| 6,165,837 A | 12/2000 | Kawakubo et al. |
| 6,346,732 B1 | 2/2002 | Mizushima et al. |
| 6,583,034 B2 | 6/2003 | Ramdani et al. |
| 6,683,012 B2 | 1/2004 | Hata et al. |
| 6,693,298 B2 | 2/2004 | Eisenbeiser et al. |
| 7,794,544 B2* | 9/2010 | Nguyen et al. ............... 118/715 |
| 7,956,207 B2* | 6/2011 | Meiere et al. ................... 556/51 |
| 2001/0052621 A1 | 12/2001 | Beaman |
| 2003/0008521 A1 | 1/2003 | Bojarczuk, Jr. et al. |
| 2003/0127646 A1 | 7/2003 | Christiansen et al. |
| 2005/0266663 A1 | 12/2005 | Bojarczuk et al. |
| 2008/0087890 A1* | 4/2008 | Ahn et al. ....................... 257/43 |

FOREIGN PATENT DOCUMENTS

| | | |
|---|---|---|
| DE | 41 31 307 | 9/1991 |
| JP | 62-226892 | 10/1987 |
| JP | 11-233440 | 8/1999 |
| JP | 2001-102555 | 4/2001 |
| WO | WO 95/03887 | 2/1995 |
| WO | WO 03/096385 | 11/2003 |

OTHER PUBLICATIONS

Aarik et al., "Atomic Layer Deposition of Crystalline Al2O3 Thin Films", Presentation at the Institute of Physics, University of Tartu, Tartu, Estonia.

Aarik et al., "Phase Transformations in Hafnium Dioxide Thin Films Grown by Atomic Layer Deposition at High Temperatures", Applied Surface Science, 2001, vol. 173, pp. 15-21.

(Continued)

Primary Examiner — Charles Garber
Assistant Examiner — Andre' C Stevenson
(74) Attorney, Agent, or Firm — Knobbe, Martens, Olson & Bear, LLP

(57) ABSTRACT

Methods are provided herein for forming metal oxide thin films by atomic layer deposition. The metal oxide thin films can be deposited at high temperatures such that the thin film is crystalline as deposited. The metal oxide thin films can be used, for example, as dielectric oxides in transistors, flash devices, capacitors, integrated circuits, and other semiconductor applications.

17 Claims, 4 Drawing Sheets

(56) References Cited

OTHER PUBLICATIONS

Antonell et al., "Composition Dependence of Solid-Phase Epitaxy in Silicon-Germanium Alloys: Experiment and Theory", Physical Review, Mar. 15, 1995, vol. 51, Issue 12, pp. 7762-7771.

Bae et al., "Effects of Processing Parameters on Alumina Coatings Deposited on Nickel Substrates by Reacting Aluminum Chloride and Hydrogen/Carbon Dioxide Gas Mixtures", Journal of the American Ceramic Society, 1998, vol. 81, Issue 7, pp. 1945-1948 (abstract).

Bauer et al., "Crystalline to Amorphous Phase Transition in Very Low Temperature Molecular Beam Epitaxy", Materials Science and Engineering, 2002, vol. B89, pp. 263-268.

Bauer et al., "High Ge Content Photodetectors on Thin SiGe Buffers", Materials Science and Engineering, 2002, vol. B89, pp. 77-83.

Bauer et al., "Relaxed SiGe Buffers with Thicknesses Below 0.1 um", Thin Solid Films, 2000, vol. 369, pp. 152-156.

Bauer et al., "Time Resolved Reflectivity Measurements of Silicon Solid Phase Epitaxial Regrowth", Thin Solid Films, 2000, vol. 364, pp. 228-232.

Catoire et al., "High-Temperature Kinetics of AlCl3 Decomposition in the Presence of Additives for Chemical Vapor Deposition", Journal of the Electrochemical Society, 2002, vol. 149, Issue 5, pp. C261-C267 (abstract).

Herzog et al., "Si/SiGe n-MODFETs on Thin SiGe Virtual Substrates Prepared by Means of He Implantation", IEEE Electron Device Letters, Aug. 2002, vol. 23, Issue 8, pp. 485-487.

Huang et al., "SiGe-on-Insulator Prepared by Wafer Bonding and Layer Transfer for High-Performance Field-Effect Transistors", Applied Physics Letters, Feb. 26, 2001, vol. 78, Issue 9, pp. 1267-1269.

Kasper et al., "New Virtual Substrate Concept for Vertical MOS Transistors", Thin Solid Films, 1998, vol. 336, pp. 319-322.

Kommu et al., "A Theoretical/Experimental Study of Silicon Epitaxy in Horizontal Single-Wafer Chemical Vapor Deposition Reactors", Journal of the Electrochemical Society, 2000, vol. 147, Issue 4, pp. 1538-1550.

Kutsukake et al., "Fabrication of SiGe-on-Insulator Through Thermal Diffusion of Ge on Si-on-Insulator Substrate", Jpn. J. Appl. Phys., 2003, vol. 42, pp. L232-L234.

Luysberg et al., "Effect of Helium Ion Implantation and Annealing on the Relaxation Behavior of Pseudomorphic $Si_{1-x}Ge_x$ Buffer Layers on Si (100) Substrates", Journal of Applied PHysics, Oct. 15, 2002, vol. 92, Issue 8, pp. 4290-4295.

Lyutovich et al., "Relaxed SiGe Buffer Layer Growth with Point Defect Injection", Materials Science and Engineering, 2000, vol. B71, pp. 14-19.

Lyutovich et al., "Thin SiGe Buffers with High Ge Content for n-MOSFETs", Materials Science and Engineering, 2002, vol. B89, pp. 341-345.

Ni et al., "X-Ray Reciprocal Space Mapping Studies of Strain Relaxation in Thin SiGe Layers (<100nm) Using a Low Temperature Growth Step", Journal of Crystal Growth, 2001, vol. 227-228, pp. 756-760.

Nieminen et al., "Surface-Controlled Growth of LaAlO3 Thin Films by Atomic Layer Epitaxy", J. Mater. Chem., 2001, vol. 11, pp. 2340-2345.

Nitodas et al., Chemical Vapor Deposition of Silicon Dioxide, Aluminum Oxide, and Mullite from Mixtures of Aluminum Trichloride, Chlorosilane, Carbon Dioxide, and Hydrogen, Electrochemical Society, 2001, vol. 2001, Issue 22, pp. 655-662 (abstract).

Sugii et al., "SiGe-on-Insulator Substrate Fabricated by Melt Solidification for a Strained-Silicon Complementary Metal-Oxide-Semiconductor", J. Vac. Sci. Technol. B, Sep./Oct. 2002, vol. 20, Issue 5, pp. 6 pages.

Sundqvist et al., "Atomic Layer Deposition of Polycrystalline HfO2 Films by the HfI4—O-2 Precursor Combination", Thin Solid Films, 2003, vol. 427, Issue 1-2, pp. 147-151 (abstract).

Tan et al., "Gas-Phase Kinetic Modeling of the AlCl3 Decomposition in the AlCl-CO2-H2-HCl System for a Hot-Wall CVD Reactor", Journal of the Electrochemical Society, 2005, vol. 152, Issue 5, pp. C288-C293 (abstract).

\* cited by examiner

HIGH TEMPERATURE ATOMIC LAYER DEPOSITION OF DIELECTRIC OXIDES

BACKGROUND OF THE INVENTION

1. Field of the Invention

The present application relates generally to high temperature atomic layer deposition of oxide thin films. The oxide films may serve, for example, as a dielectric material in a semiconductor device.

2. Description of the Related Art

Atomic layer deposition (ALD) is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves typically less or no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference. Variations of ALD have been proposed that allow for modulation of the growth rate. However, to provide for high conformality and thickness uniformity, these reactions are still more or less self-saturating.

Chemical vapor deposition (CVD) is a process in which atoms or molecules contained in a vapor deposit on a surface to form a film. CVD allows for the growth of films on device surface areas, including "epitaxial" films comprised of a crystalline silicon-containing material. Typically, CVD processes require higher temperatures to initiate reactions. In contrast to ALD, CVD is not a self-limiting process.

SUMMARY OF THE INVENTION

In accordance with one aspect of the present invention, methods for forming metal oxide thin films on a substrate in a reaction chamber by atomic layer deposition are provided. In some embodiments, the methods include: a first metal oxide deposition cycle comprising: providing a vapor phase pulse of a first reactant comprising a first metal precursor to the reaction chamber such that it forms no more than a monolayer on the substrate; removing excess first reactant from the reaction chamber; providing a vapor phase pulse of a second reactant comprising hydrogen and carbon dioxide to the reaction chamber; and removing excess second reactant and any reaction byproducts from the reaction chamber; wherein the providing and removing steps are repeated until a thin metal oxide film of a desired thickness and composition is obtained, wherein the substrate temperature during the providing and removing steps is above about 600° C. In some embodiments, only hydrogen and carbon dioxide are used at high temperatures, such as above about 600° C.

In accordance with another aspect of the present invention, methods for forming silicon dioxide thin films by atomic layer deposition on a substrate in a reaction chamber are provided. In some embodiments, the methods include: alternately and sequentially providing a vapor phase reactant pulse comprising a silicon precursor and a vapor phase reactant pulse comprising an oxygen precursor to the reaction chamber; wherein the vapor phase reactant pulses are repeated until a thin film of a desired thickness is obtained; wherein the substrate temperature during the pulses is above about 600° C.

In accordance with another aspect of the present invention, methods for forming thin films comprising titanium dioxide by atomic layer deposition on a substrate in a reaction space are provided. In some embodiments, the methods include: alternately and sequentially providing a vapor phase reactant pulse comprising a titanium precursor and a vapor phase reactant pulse comprising an oxygen precursor to the substrate in the reaction space; wherein the alternate and sequential pulses are repeated until a thin film of a desired thickness is obtained, wherein the substrate temperature during the pulses is above about 600° C.

In accordance with another aspect of the present invention, atomic layer deposition processes for forming crystalline dielectric thin films are provided. In some embodiments, the processes include alternately and sequentially contacting a substrate comprising a crystalline surface with a vapor phase reactant pulse comprising a first metal precursor and a vapor phase reactant pulse comprising an oxygen precursor; and repeating the alternate and sequential pulses until a thin film of a desired thickness is obtained; wherein the thin film formed on the substrate is crystalline as deposited; wherein the substrate temperature during the pulses is above about 600° C.

In accordance with another aspect of the present invention, methods for forming memory capacitors are provided. In some embodiments, the methods include depositing a bottom electrode on a substrate; depositing a dielectric oxide layer over the bottom electrode by an atomic layer deposition process comprising alternating and sequential pulses of a metal source and pulses of an oxygen source, wherein the temperature of the substrate is above 650° C., wherein the dielectric layer is crystalline as deposited; and depositing a top electrode on top of the dielectric layer.

In accordance with another aspect of the present invention, methods for forming dielectric oxides as part of a transistor on a substrate are provided. One example of a transistor is a floating gate transistor that can be used in flash memories. In some embodiments, the methods include: depositing a dielectric oxide layer over one or more gate electrodes on a substrate by an atomic layer deposition process; wherein the temperature of the substrate is above about 650° C. when depositing; wherein the dielectric oxide layer is crystalline as deposited; depositing a semiconductor on the dielectric oxide layer; and depositing electrically conductive source and drain electrodes on top of the semiconductor such that the source and drain electrodes align with the gate electrodes.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiments disclosed.

DETAILED DESCRIPTION OF THE PREFERRED EMBODIMENT

Figure 1:
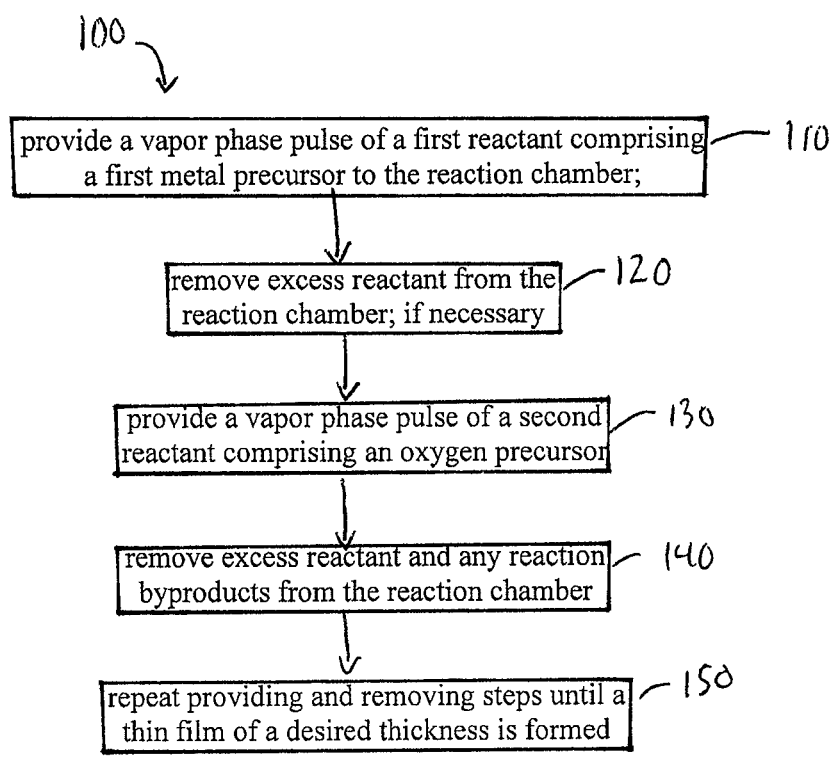
FIG. 1 is a flow chart generally illustrating a method for forming a metal oxide thin film in accordance with one embodiment.

Typically, CVD processes have been used for higher temperature growth because the reactions occur more rapidly at higher temperatures. ALD processes can be used to deposit films at lower temperatures with the surface reactions. Some ALD processes can lose their self limiting nature at high temperatures. Higher temperatures can cause undesirable decomposition of some precursors, for example, the precursors can react with each other or the species adsorption on the substrate surface can be altered. Some precursor decomposition reactions can disrupt the self limiting nature of the ALD process if the products of the decomposition reaction react with each other and/or react with the adsorbed species to deposit material on the substrate surface. In addition, high temperature ALD processes have been avoided because commercially available reactors were not able to withstand the higher process temperatures. For example, metal reactors cannot typically withstand the higher process temperatures.

While illustrated in the context of forming a metal oxide or dielectric oxide layer in part of an integrated circuit, such as a capacitor or transistor, the skilled artisan will readily appreciate the application of the principles and advantages disclosed herein to various contexts in which metal oxide and dielectric oxide thin films are useful. For example, transparent titanium oxide films can be used in flat panel displays, LEDs, and solar cells.

Dielectric oxide thin films can be deposited on a substrate by atomic layer deposition (ALD) type processes. In some embodiments, dielectric oxide thin films are deposited at a high temperature, for example, at a temperature above 500° C. In some embodiments, the dielectric oxide thin films are crystalline as deposited.

ALD

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

ALD processes are preferred to chemical vapor deposition processes (CVD) in some applications because the self limiting nature of ALD processes allows greater control of film growth. ALD processes can also produce thin films with greater crystallinity than some CVD processes.

Briefly, a substrate is loaded into a reaction chamber and is heated to a suitable deposition temperature, generally at lowered pressure. Deposition temperatures are typically maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature is preferably above about 500° C., more preferably above about 600° C., and most preferably above 700° C. In some embodiments, the temperature is preferably above about 800° C., more preferably above about 900° C., and most preferably above about 1000° C. Particular deposition temperatures for some specific embodiments are provided below.

A first reactant is conducted or pulsed into the chamber in the form of vapor phase pulse and contacted with the surface of the substrate. Conditions are preferably selected such that no more than about one monolayer of the first reactant is adsorbed on the substrate surface in a self-limiting manner. Excess first reactant and reaction byproducts, if any, are removed from the reaction chamber, such as by purging with an inert gas. The appropriate pulsing and purging times can be readily determined by the skilled artisan based on the particular circumstances.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed. Also, batch ALD reactors can utilize longer purging times because of increased volume and surface area.

A second gaseous reactant is pulsed into the chamber where it reacts with the first reactant bound to the surface. Excess second reactant and gaseous byproducts of the surface reaction are removed from the reaction chamber, preferably by purging with the aid of an inert gas and/or evacuation. The steps of pulsing and purging are repeated until a thin film of the desired thickness has been formed on the substrate, with each cycle leaving typically less than or no more than a molecular monolayer.

As mentioned above, each pulse or phase of each cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage.

FIG. 1 is a flow chart generally illustrating a method for forming a metal oxide thin film in accordance with one embodiment. According to a preferred embodiment, a crystalline metal oxide thin film is formed on a substrate by an ALD type process 100 comprising multiple metal oxide deposition cycles, each metal oxide deposition cycle comprising:

providing a vapor phase pulse of a first reactant comprising a metal precursor to the reaction chamber such that it forms no more than a monolayer on the substrate;

removing excess first reactant from the reaction chamber;

providing a vapor phase pulse of a second reactant comprising an oxygen precursor to the reaction chamber; and removing excess second reactant and any reaction byproducts from the reaction chamber.

This can be referred to as the metal oxide deposition cycle. The providing and removing steps are repeated until a thin film of a desired thickness and composition is obtained. In some embodiments the thin film is crystalline as deposited. Preferably the substrate temperature is above about 600° C. during the providing and removing steps. In some embodiments the substrate temperature during the providing and removing steps is preferably above about 700° C., more preferably above about 800° C., even more preferably above 900° C., and most preferably above 1000° C.

First, a vapor phase reactant pulse comprising a metal precursor is provided to the substrate and reaction chamber 110. The metal precursor is preferably a halide. Preferably the precursor is selected such that if it decomposes at the given process conditions it does not adversely affect the deposition process. Preferably the metal precursor comprises one or more of Ti, Al, Hf, Si, and Zr. In some embodiments metal halides are used, for example compounds having the formula $MX_n$, where M is a metal, X is a halogen, such as fluoride, chloride, bromide or iodide, preferably a chloride or iodide, and n is equal to the valence of M, for example $TiCl_4$, $TiBr_4$, and $TiI_4$ when M is Ti. In some preferred embodiments metal halide precursors comprise $AlCl_3$, $HfCl_4$, $HfI_4$, $SiCl_4$, $SiBr_4$, $SiI_4$, $SiF_4$, $ZrCl_4$ and $ZrI_4$.

Preferably, the metal precursor is provided such that it forms no more than about a single molecular layer on the substrate. If necessary, any excess metal precursor can be purged or removed 120 from the reaction space. In some embodiments, the purge step can comprise stopping the flow of titanium precursor while still continuing the flow of an inert carrier gas such as nitrogen or argon. Preferably, the metal precursor decomposition temperature is above the substrate temperature during deposition.

Next, a vapor phase reactant pulse comprising an oxygen source or precursor is provided 130 to the substrate and reaction chamber. Any of a variety of oxygen precursors can be used, including, without limitation: oxygen, plasma excited oxygen, atomic oxygen, ozone, water, oxygen/hydrogen, hydrogen/carbon dioxide, nitric oxide (NO), nitrogen dioxide ($NO_2$), nitrous oxide ($N_2O$), hydrogen peroxide ($H_2O_2$), etc. A suitable oxygen precursor can be selected by the skilled artisan such that it reacts with the molecular layer of the metal precursor on the substrate to form a metal oxide given the particular process conditions. Each metal oxide deposition cycle typically forms less than or no more than about one molecular layer of metal oxide. If necessary, any excess reaction byproducts or oxygen precursor can be removed 140 from the reaction space. In some embodiments, the purge step can comprise stopping the flow of oxygen precursor while still continuing the flow of an inert carrier gas such as nitrogen or argon. Preferably the oxygen precursor has a decomposition temperature above the substrate temperature during deposition. In some embodiments the oxygen precursor may decompose at the substrate deposition temperature but does not disrupt the self limiting nature of the ALD process.

The oxygen source may be an oxygen-containing gas pulse and can be a mixture of oxygen and inactive gas, such as nitrogen or argon. In some embodiments the oxygen source may be a molecular oxygen-containing gas pulse. One source of oxygen may be air. In preferred embodiments, the oxygen source or precursor is water. In some embodiments the oxygen source comprises an activated or excited oxygen species. In some embodiments the oxygen source comprises ozone. The oxygen source may be pure ozone or a mixture of ozone and another gas, for example an inactive gas such as nitrogen or argon. In other embodiments the oxygen source is oxygen plasma. It is noted that at very high temperatures nitrogen may not be an inert or inactive gas, but it could still be used in embodiments described herein, if desired.

The oxygen precursor pulse may be provided, for example, by pulsing ozone or a mixture of ozone and another gas into the reaction chamber. In other embodiments, ozone is formed inside the reactor, for example by conducting oxygen containing gas through an arc. In other embodiments an oxygen containing plasma is formed in the reactor. In some embodiments the plasma may be formed in situ on top of the substrate or in close proximity to the substrate. In other embodiments the plasma is formed upstream of the reaction chamber in a remote plasma generator and plasma products are directed to the reaction chamber to contact the substrate. As will be appreciated by the skilled artisan, in the case of remote plasma the pathway to the substrate can be optimized to maximize electrically neutral species and minimize ion survival before reaching the substrate.

The metal oxide deposition cycle is typically repeated a predetermined number of times 150. In some embodiments, multiple molecular layers of metal oxide are formed by multiple deposition cycles. In other embodiments, a molecular layer or less of metal oxide is formed.

Removing excess reactants can include evacuating some of the contents of the reaction space or purging the reaction space with argon, helium, nitrogen or any other inert gas. In some embodiments purging can comprise turning off the flow of the reactive gas while continuing to flow an inert carrier gas to the reaction space.

The precursors employed in the ALD type processes may be solid, liquid or gaseous material under standard conditions (room temperature and atmospheric pressure), provided that the precursors are in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Preferably, for a 300 mm wafer in a single wafer ALD reactor, a metal precursor, such as a Ti, Al, Hf, Si, or Zr precursor, is pulsed for from 0.05 to 10 seconds, more preferably for from 0.1 to 5 seconds and most preferably for about 0.3 to 3.0 seconds. An oxygen-containing precursor is preferably pulsed for from about 0.05 to 10 seconds, more preferably for from 0.1 to 5 seconds, most preferably for from about 0.2 to 3.0 seconds. However, pulsing times can be on the order of minutes in some cases. The optimum pulsing time can be readily determined by the skilled artisan based on the particular circumstances.

The mass flow rate of the precursors can also be determined by the skilled artisan. In one embodiment, for deposition on 300 mm wafers the flow rate of metal precursors is preferably between about 1 and 1000 sccm without limitation, more preferably between about 100 and 500 sccm. The mass flow rate of the metal precursors is usually lower than the mass flow rate of the oxygen source, which is usually between about 10 and 10000 sccm without limitation, more preferably between about 100-2000 sccm and most preferably between 100-1000 sccm.

The pressure in the reaction chamber is typically from about 0.01 to about 20 mbar, more preferably from about 1 to about 10 mbar. However, in some cases the pressure will be higher or lower than this range, as can be readily determined by the skilled artisan. Atmospheric pressure could also be used for these high temperature reactions.

Before starting the deposition of the film, the substrate is typically heated to a suitable growth temperature. Preferably, the growth temperature of the metal oxide thin film is above about 500° C., more preferably above about 600° C., even more preferably above about 700° C., and most preferably above about 800° C. In some embodiments, the substrate temperature can be above about 900° C. or even above about 1000° C.

Typically, with lower temperature ALD metal oxide processes, such as 100° C. to 300° C., the growth temperature is less than the crystallization temperature for the deposited materials such that an amorphous thin film is formed. However, higher deposition temperatures, such as above about 500° C., can result in formation of crystalline films as deposited. The crystallinity of the deposited thin film may vary based on a number of factors, such as the precursors, temperature, substrate composition, crystallinity of the substrate, etc. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. Preferably, the deposition temperature is selected such that a crystalline thin film is deposited. The specific growth temperature for a particular thin film composition may be selected by the skilled artisan using routine experimentation.

The deposition cycles can be repeated a predetermined number of times or until a desired thickness is reached. Preferably, the thin films are between about 5 Å and 200 nm thick, more preferably between about 10 Å and 100 nm thick.

In some embodiments, the thin films deposited by the methods described herein are crystalline as deposited. In some embodiments a crystalline metal oxide or dielectric oxide is preferred because typically the dielectric constant of the material increases with increased crystallinity. In some embodiments, the crystalline films are deposited without annealing the film. In some embodiments the crystalline lattice structure of the underlying substrate is replicated by the deposited thin film. In other embodiments amorphous thin films are deposited.

Binary Metal Oxides

In some embodiments a second metal oxide deposition cycle can be performed. The metal precursor in the second metal oxide deposition cycle can be the same or different from the metal precursor used in the first metal oxide deposition cycle. The first metal oxide deposition cycle can be as described above.

The first metal oxide deposition cycle is typically repeated a predetermined number of times. In some embodiments, multiple molecular layers of the first metal oxide are formed by multiple deposition cycles. In other embodiments, a molecular layer or less of the first metal oxide is formed.

A second metal precursor can be provided to form an oxide with two different metals. The second metal precursor and an oxygen precursor can be alternately and sequentially provided. Thus a second ALD cycle is performed, which can be referred to as the second metal oxide deposition cycle.

According to some embodiments, the second metal oxide deposition cycle preferably comprises:

providing a vapor phase reactant pulse comprising a second metal precursor to the reaction chamber;

removing excess reactant from the reaction chamber;

providing a vapor phase reactant pulse comprising an oxygen precursor to the reaction chamber such that the oxygen precursor reacts with the metal precursor on the substrate; and removing excess reactant and any reaction byproducts from the reaction chamber.

The first and second metal oxide deposition cycles are repeated until a thin film of a desired thickness and composition is obtained.

Multiple metal oxide layers comprising the first metal can be formed on top of each other or formed in a desired pattern with the second metal oxide layers, such as alternating layers or two first metal layers for every second metal layer, etc. In some embodiments, the first metal oxide deposition cycle is repeated for 0.01 to 100 times and more preferably 0.1 to 10 and most preferably 0.25 to 4 times for each second metal oxide cycle.

In some embodiments, the first metal oxide deposition cycle can be repeated multiple times before moving to the second metal oxide deposition cycle. For example, the first metal oxide cycle can be repeated ten times followed by three cycles of the second metal oxide deposition cycle.

The first metal oxide layers can be formed according to the cycles described herein. A second metal precursor is selected depending on the desired composition of the thin film. The second metal precursor is preferably a halide. Preferably the precursor is selected such that if it decomposes at the given process conditions it does not adversely affect the deposition process. Preferably the metal precursor comprises one or more of Ti, Al, Hf, Si, and Zr. Preferred halides include compounds having the formula $MX_n$, where M is a metal, X is a halogen, such as fluoride, chloride, bromide or iodide, preferably a chloride or iodide, and n is equal to the valence of M, for example $TiCl_4$, $TiBr_4$, and $TiI_4$ when M is Ti. Other preferred metal precursors comprise $AlCl_3$, $HfCl_4$, $HfI_4$, $SiCl_4$, $SiBr_4$, $SiI_4$, $SiF_4$, $ZrCl_4$ and $ZrI_4$.

In a preferred embodiment the first metal precursor comprises aluminum and the second metal precursor comprises hafnium. Therefore, the first metal oxide deposition cycle forms $Al_2O_3$ and the second metal oxide deposition cycle forms $HfO_2$. The aluminum oxide and hafnium oxide deposition cycles can be repeated based on the desired composition of the resulting thin film. For example, in some embodiments the deposition cycles can be alternated or varied such that alternating layers of aluminum oxide and hafnium oxide are formed. In other embodiments, multiple layers of aluminum oxide are formed followed by one or more layers of hafnium oxide. In some embodiments less than a molecular layer of hafnium oxide or aluminum oxide is formed before deposition of the other metal oxide. The composition of the thin film varies according to the ratio of the aluminum and hafnium deposition cycles. The composition of the thin film can be expressed as $HfAl_yO_z$, with x typically between about 0 and 1, y typically between about 0 and 2, and z between about 2 and 3.

Deposition of Metal Oxide Thin Films with Carbon Dioxide and Hydrogen

According to another preferred embodiment, a metal oxide thin film is formed on a substrate by an ALD type process comprising multiple deposition cycles, each deposition cycle comprising:

providing a vapor phase pulse of a first reactant comprising a metal precursor to the reaction chamber such that it forms no more than a monolayer on the substrate;

removing excess first reactant from the reaction chamber;

providing a vapor phase pulse of a second reactant comprising hydrogen and carbon dioxide to the reaction chamber; and removing excess second reactant and any reaction byproducts from the reaction chamber.

The providing and removing steps are repeated until a thin metal oxide film of a desired thickness and composition is obtained. In some embodiments the thin film is crystalline as deposited. Preferably the substrate temperature is above about 600° C. during the providing and removing steps. In some embodiments the substrate temperature during the providing and removing steps is preferably above about 700° C., more preferably above about 800° C., even more preferably above 900° C., and most preferably above 1000° C.

A vapor phase pulse of a metal precursor is provided to the reaction chamber. The metal precursor can be provided such that it forms no more than one monolayer of material on the substrate. Preferably the metal precursor comprises one of Ti, Al, Hf, Si, and Zr. Preferred halides include compounds having the formula $MX_n$, where M is a metal, X is a halogen and n is equal to the valence of M, for example $TiCl_4$, $TiBr_4$, and $TiI_4$ when M is Ti. Other preferred metal precursors comprise $AlCl_3$, $HfCl_4$, $SiCl_4$, $SiF_4$, and $ZrCl_4$.

Next, a vapor phase reactant pulse comprising carbon dioxide and hydrogen is provided to the reaction chamber. The carbon dioxide and hydrogen can be provided such that they react with the metal precursor on the substrate surface. The deposition cycle can be repeated until the metal oxide thin film reaches the desired thickness.

In some embodiments, the process conditions for the thin film deposition with carbon dioxide and hydrogen can be as described above in reference to the metal oxide deposition cycle.

The temperature can be selected by the skilled artisan based on the desired crystalline structure of the deposited thin film. In some embodiments an amorphous metal oxide is deposited. In other embodiments it is preferable to deposit a crystalline metal oxide. Typically, higher temperatures are used to deposit crystalline metal oxide thin films.

Deposition of Thin Films Comprising Silicon Dioxide

Figure 2:
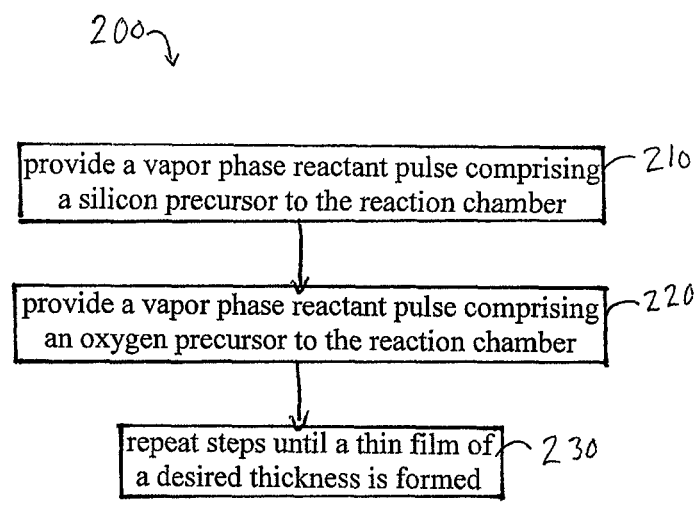
FIG. 2 is a flow chart generally illustrating a method for forming a silicon dioxide thin film in accordance with one embodiment.

In some embodiments, methods are provided for depositing thin films comprising silicon dioxide. FIG. 2 is a flow chart generally illustrating a method 200 for forming a silicon dioxide thin film in accordance with one embodiment. A vapor phase pulse of a silicon precursor is provided 210 to the reaction chamber. The silicon precursor can be provided such that it forms no more than one monolayer of material on the substrate. Preferred silicon precursors include silicon halides, including $SiF_4$ and $SiCl_4$. Next, a vapor phase reactant pulse comprising an oxygen precursor is provided 220 to the reaction chamber. The oxygen precursor can be provided such that it reacts with the silicon precursor on the substrate surface. Preferred oxygen precursors include $O_2$, $O_2/H_2$, $H_2/CO_2$, $H_2O$, $O_3$, $NO$, $NO_2$, $N_2O$, and $H_2O_2$. Preferably the substrate temperature during pulses of silicon and oxygen precursors is above about 600° C. The cycle can be generally referred to as a silicon dioxide deposition cycle. The deposition cycle can then be repeated 230 with step 210, providing a vapor phase pulse of a silicon precursor and step 220 providing a vapor phase reactant pulse of an oxygen precursor. The deposition cycle can be repeated 230 until the silicon dioxide thin film reaches the desired thickness.

In some embodiments, the process conditions for the silicon dioxide deposition can be as described above in reference to the metal oxide deposition cycle. The temperature can be selected by the skilled artisan based on the desired crystalline structure of the deposited thin film. For example, silicon dioxide can form α-quartz (rhombohedral/trigonal) at temperatures up to about 573° C. and β-quartz (hexagonal) at temperatures above 573° C. In some embodiments the temperature of the substrate is selected to deposit the desired quartz crystalline structure. In some embodiments amorphous silicon dioxide is deposited. In other embodiments it is preferable to deposit quartz silicon dioxide. Typically, higher temperatures are used to deposit crystalline silicon dioxide. Preferably the substrate temperature while providing a silicon precursor and an oxygen precursor is above about 600° C. In some embodiments the substrate temperature during the providing and removing steps is preferably above about 700° C., more preferably above about 800° C., even more preferably above 900° C., and most preferably above 1000° C.

Deposition of Thin Films Comprising Titanium Dioxide

Figure 3:
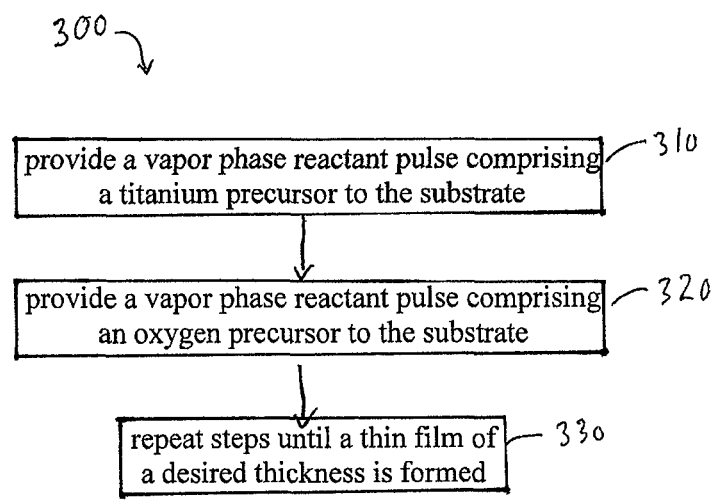
FIG. 3 is a flow chart generally illustrating a method for forming a thin titanium oxide film in accordance with one embodiment.

In some embodiments, methods are provided for depositing thin films comprising titanium dioxide. FIG. 3 is a flow chart generally illustrating a method 300 for forming a thin titanium oxide film in accordance with one embodiment. A vapor phase pulse of a titanium precursor is provided 310 to the reaction chamber. The titanium precursor can be provided such that it forms no more than one monolayer of material on the substrate. Preferred titanium precursors include titanium halides, including $TiCl_4$. Next, a vapor phase reactant pulse comprising an oxygen precursor is provided 320 to the reaction chamber. The oxygen precursor can be provided such that it reacts with the silicon precursor on the substrate surface. Preferred oxygen precursors include $O_2$, $O_2/H_2$, $H_2/CO_2$, $H_2O$, $O_3$, $NO$, $NO_2$, $N_2O$, and $H_2O_2$. Preferably the substrate temperature during pulses of titanium and oxygen precursors is above about 600° C. The cycle can be generally referred to as a titanium dioxide deposition cycle. In step 330 the cycle can be repeated with step 310, providing a vapor phase pulse of a titanium precursor. The deposition cycle can be repeated 330 until the thin film comprising titanium dioxide reaches the desired thickness.

In some embodiments, the process conditions and precursors for the titanium dioxide deposition can be as described above in reference to the metal oxide deposition cycle. The deposition temperature can be selected by the skilled artisan based on the desired crystalline structure of the deposited thin film. In some embodiments amorphous titanium dioxide is deposited. In other embodiments it is preferable to deposit anatase titanium oxide.

Typically, higher temperatures are used to deposit crystalline titanium dioxide. Preferably the substrate temperature while providing a titanium precursor and an oxygen precursor is above about 600° C., more preferably the temperature is above about 700° C., and most preferably above about 800° C. In some embodiments the substrate temperature can be above about 900° C. or above about 1000° C.

Crystalline titanium oxide thin films can have additional advantages or desirable properties over amorphous thin films. For example, titanium oxide with anatase crystallinity has enhanced optical transmission properties versus amorphous titanium oxide. Application Ser. No. 12/129,609 entitled "Methods for Forming Conductive Titanium Oxide Thin Films" by Pore et al. discloses various properties of anatase titanium oxide thin films, the disclosure of which is incorporated by reference herein. Titanium oxide in the anatase phase has good optical transmission properties making it transparent. In some embodiments, titanium oxide thin films in the anatase phase can have optical transmittance greater than about 60% in the visible region. Optical transmittance can be measured, for example, by using a UV/VIS-spectrometer.

Crystalline titanium oxide thin films can also be used outside of microelectronic applications, for example in optics applications such as transparent conducting oxides, chemical sensors, and optics components.

Deposition of Thin Films Comprising Aluminum Oxide

In some embodiments, methods are provided for depositing thin films comprising aluminum oxide. In some embodiments, a vapor phase pulse of an aluminum precursor is provided to the reaction chamber. The aluminum precursor can be provided such that it forms no more than one monolayer of material on the substrate. Preferred aluminum precursors include aluminum halides, including $AlCl_3$. Next, a vapor phase reactant pulse comprising an oxygen precursor is provided to the reaction chamber. The oxygen precursor can be provided such that it reacts with the aluminum precursor on the substrate surface. Preferred oxygen precursors include $O_2$, $O_2/H_2$, $H_2/CO_2$, $O_3$, $H_2O$, NO, $NO_2$, $N_2O$, and $H_2O_2$. Preferably the substrate temperature during pulses of aluminum and oxygen precursors is above about 600° C. The cycle can be generally referred to as an aluminum oxide deposition cycle. The deposition cycle can be repeated until the aluminum oxide thin film reaches the desired thickness.

In some embodiments, the process conditions for the silicon dioxide deposition can be as described above in reference to the metal oxide deposition cycle. The temperature can be selected by the skilled artisan based on the desired crystalline structure of the deposited thin film. In some embodiments amorphous aluminum oxide is deposited. In some embodiments it is preferable to deposit $\alpha$-$Al_2O_3$, which is also known as corundum. Corundum has a trigonal Bravais lattice. The lattice cell typically has two formula units of aluminum oxide. The oxygen ions almost form a hexagonal close-packed structure with aluminum ions filling two-thirds of the octahedral interstices. The $\alpha$-$Al_2O_3$ thin films can be used in charge trapping flash devices as the blocking oxide.

Typically, higher temperatures are used to deposit crystalline $\alpha$-$Al_2O_3$. Preferably the substrate temperature while providing an aluminum precursor and an oxygen precursor is above about 600° C., more preferably the temperature is above about 700° C., and most preferably above about 800° C. In some embodiments the substrate temperature can be above about 900° C. or above about 1000° C.

Crystalline aluminum oxide thin films can also be used outside of microelectronic applications, for example in optics applications such as transparent conducting oxides, chemical sensors, and optics components.

Figure 4:
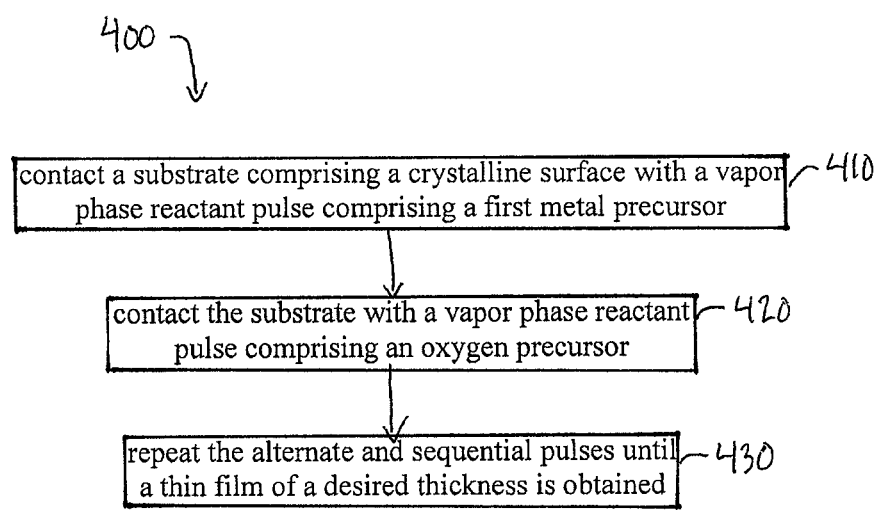
FIG. 4 is a flow chart generally illustrating a method for forming a crystalline dielectric thin film in accordance with one embodiment.

Deposition of Thin Films with the Same Crystallinity as the Underlying Substrate In some embodiments methods are provided for depositing a thin film on a substrate by ALD with the same crystalline lattice structure as the underlying substrate. Preferably the dielectric oxide is deposited on a substrate surface with regions of crystallinity comprising a crystalline lattice structure. FIG. 4 is a flow chart generally illustrating a method 400 for forming a crystalline dielectric thin film in accordance with one embodiment. A comprising a crystalline surface is contacted with a vapor phase reactant pulse comprising a first precursor 410. Preferably, the first precursor is provided such that it forms no more than one monolayer of material on the substrate. Preferred first precursors include aluminum, silicon, titanium, zirconium, and hafnium. Preferably the first precursor is a halide, for example $AlCl_3$, $SiCl_4$, $TiCl_4$, $ZrCl_4$, and $HfCl_4$. Next, the substrate is contacted with a vapor phase reactant pulse comprising an oxygen precursor 420.

The oxygen precursor can be provided such that it reacts with the first precursor on the substrate surface. Preferred oxygen precursors include $O_2$, $O_2/H_2$, $H_2/CO_2$, $H_2O$, $O_3$, NO, $NO_2$, $N_2O$, and $H_2O_2$. Preferably the substrate temperature during pulses of the first precursor and oxygen precursor is above about 600° C. In some embodiments the substrate temperature during the contacting steps is preferably above about 700° C., more preferably above about 800° C., even more preferably above about 900° C., and most preferably above 1000° C. The deposition steps can be repeated 430 until the dielectric thin film reaches the desired thickness.

In some embodiments, the process conditions and precursors for the crystalline dielectric oxide deposition can be as described above in reference to the metal oxide deposition cycle. The deposition temperature can be selected by the skilled artisan based on the desired crystallinity of the deposited dielectric oxide thin film. Preferably the dielectric oxide thin film is crystalline as deposited without a subsequent annealing step. Preferably, the crystalline lattice structure of the deposited dielectric oxide thin film is the same as the crystalline lattice structure of the substrate surface.

Applications

Dielectric oxide films may be used, for example, in a capacitor between top and bottom electrodes. In some embodiments, a capacitor suitable for use in an integrated circuit is formed by a method comprising:

depositing a bottom electrode;

depositing a dielectric oxide layer over the bottom electrode by an atomic layer deposition process comprising alternating and sequential pulses of a metal source and pulses of an oxygen source, wherein the temperature of the substrate is above 650° C., wherein the dielectric layer is crystalline as deposited; and depositing a top electrode directly over and contacting the ultra-high-k layer.

In one embodiment of a method for forming a memory capacitor in an integrated circuit a bottom electrode is deposited. In some embodiments the bottom electrode is deposited by ALD. The bottom electrode can be formed of any suitable material. In some embodiments, the bottom electrode comprises a noble metal, noble metal oxide or nitride, such as: Ru, $RuO_2$, $IrO_2$, W, Ir, Pt, $SrRuO_3$, Rh, Pd, Ag, Cu, Re, Os or Au or mixtures thereof or TiN, NbN, ZrN, HfN, $MoN_x$, $WN_x$, VN or TaN or mixtures thereof, etc.

Suitable precursors for ALD of noble metal containing electrodes are described, for example, in U.S. Pat. No. 6,824,816 by Aaltonen et al. and U.S. Patent Application Publication No. 2007-0014919 by Hamalainen et al. The disclosures of both are hereby incorporated by reference in their entireties. Although Hamalainen et al. describes noble metal precursors in the context of noble metal oxide thin film deposition, the noble metal precursors described are also suitable for the deposition of noble metal thin films.

In some embodiments the bottom electrode comprises titanium. Preferable Ti precursors for depositing TiN, $Ti_{1-x}Nb_xN_y$, or $Ti_{1-x}Ta_xN_y$ electrodes include halides, cyclopentadienyl compounds, and cyclopentadienyl derivative compounds. Preferred halides include compounds having the formula $TiX_4$, where X is a halogen, such as $TiCl_4$, $TiBr_4$, $TiF_4$, and $TiI_4$.

A dielectric oxide layer can be deposited by ALD on the bottom electrode. The deposition of the dielectric oxide layer can include any of the methods described herein. Preferably the dielectric oxide layer is crystalline as deposited. Preferably the dielectric oxide layer comprises one or more of aluminum, hafnium, zirconium, titanium, and silicon. Preferably, the dielectric oxide layer comprises a material with a dielectric constant greater than 5, more preferably greater than 10 and most preferably greater than 20.

A top electrode can be deposited directly over and contacting the dielectric oxide layer, thereby forming a memory capacitor. In some embodiments the top electrode is deposited by ALD. In some embodiments, the top electrode can comprise a noble metal or nitride, such as: Ru, $RuO_2$, $IrO_2$, W, Ir, Pt, $SrRuO_3$, Rh, Pd, Ag, Cu, Re, Os or Au or mixtures thereof or TiN, NbN, ZrN, HfN, $MoN_x$, $WN_x$, VN or TaN or mixtures thereof, etc.

In one embodiment of a method for forming a transistor in an integrated circuit a dielectric oxide layer is first deposited over one or more gate electrodes on a substrate by an ALD process. The electrodes can comprise any of the materials described above in reference to forming a memory capacitor. The deposition of the dielectric oxide layer can include any of the methods described herein. Preferably the dielectric oxide layer is crystalline as deposited. Preferably the dielectric oxide layer comprises one or more of aluminum, hafnium, zirconium, titanium, and silicon. Preferably, the dielectric oxide layer comprises a material with a dielectric constant greater than 5, more preferably greater than 10 and most preferably greater than 20. Next, a semiconductor is deposited on the dielectric oxide layer. In some embodiments the semiconductor comprises one or more of silicon and germanium. Next, electrically conductive source and drain electrodes are deposited on top of the semiconductor such that the drain electrodes align with the gate electrodes.

The skilled artisan will appreciate that the dielectric oxide and metal oxide thin films described herein have many other uses, such as a floating gate dielectric layer in a flash device, as a blocking oxide in charge trapping flash devices, as a gate dielectric in memory stacks, as a dielectric oxide in other semiconductor devices, etc. The thin films described herein can also be useful in optical areas, for example, titanium dioxide can be a transparent conducting oxide used in optical components, flat panel displays, LEDs, solar cells, chemical sensors, etc.

Advantages

Dielectric oxides can be used in capacitor structures to prevent the flow of current between electrodes. As technology improves and the size of capacitors and electronic devices decrease there is a need to efficiently deposit thinner dielectric oxide layers that can effectively isolate the electrodes. High-k dielectric oxides, for example materials with dielectric constants above 5.0, can be used in these applications. Typically, the dielectric constant increases as the crystallinity of the material increases. For example, amorphous layers of material can be deposited at lower temperatures followed by a high temperature annealing step to convert the amorphous thin film to a crystalline orientation. However, it is advantageous to deposit crystalline dielectric oxide thin films by the methods described herein without requiring additional process steps such as annealing. Decreasing the number of process steps and processing time results in a decrease in the manufacturing costs. In addition depositing a crystalline thin film with a high dielectric constant allows a thinner film to meet the same performance characteristics or EOT (equivalent oxide thickness).

The ALD processes described herein have additional advantages over high temperature CVD process, in particular, the self limiting nature of ALD processes and the increased uniformity and in some cases the crystallinity of films deposited by ALD versus CVD.

Suitable Reactors

Many conventional reactors are not well suited to the higher process temperatures described by the ALD processes disclosed herein. For example, many metal reactors cannot withstand high temperatures, for example, temperature above 500° C. or 600° C. Preferably, the reactor is made out of quartz because quartz can generally withstand higher temperatures than metal. Examples of suitable reactors that may be used for high temperature processes include the commercially available ALD equipment such as Advance® 400 Series furnace reactor, available from ASM America, Inc of Phoenix, Ariz. and ASM Europe B.V., Almere, Netherlands. The Advance® 400 Series furnace reactor can withstand temperatures above 1000° C.

In some embodiments hot wall reactors are preferred because they can be cheaper to operate and easier to maintain thermal uniformity in comparison to cold wall reactors. In addition, the ALD processes described herein are compatible with hot wall reactors because they do not require rapid temperature cycling.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

The following non-limiting examples illustrate certain preferred embodiments of the invention.

EXAMPLE 1

Crystalline layers of $TiO_2$ are deposited by ALD using alternating pulses of $TiCl_4$ and an oxygen source, such as $H_2/CO_2$ with a substrate temperature of above 650° C. Other oxygen sources include $O_2$, $O_2/H_2$, $H_2/CO_2$, $H_2O$, $O_3$, NO, $NO_2$, $N_2O$, and $H_2O_2$. The crystallinity of the titanium oxide is typically anatase. The resulting anatase titanium oxide thin film can have an optical transmittance greater than about 60% in the visible spectrum.

EXAMPLE 2

Crystalline layers of $Al_2O_3$ are deposited by ALD from alternating pulses of $AlCl_3$ and an oxygen source, such as $H_2/CO_2$ with a substrate temperatures of above 650° C. Other oxygen sources that can be used include $O_2$, $O_2/H_2$, $H_2/CO_2$, $H_2O$, $O_3$, NO, $NO_2$, $N_2O$, and $H_2O_2$. The crystallinity of the aluminum oxide as deposited can be alpha-aluminum oxide.

EXAMPLE 3

$SiO_2$ is deposited by ALD from alternating pulses of $SiCl_4$ and an oxygen source, such as such as $H_2/CO_2$ with a substrate temperature of above 650° C. Other oxygen sources include $O_2$, $O_2/H_2$, $H_2/CO_2$, $H_2O$, $O_3$, NO, $NO_2$, $N_2O$, and $H_2O_2$. The crystallinity of the silicon dioxide can be quartz, for example alpha or beta quartz. At lower deposition temperatures amorphous silicon dioxide is deposited. Silicon dioxide can also be deposited using $SiF_4$.

EXAMPLE 4

Crystalline layers of $HfO_2$ are deposited on a substrate by ALD using alternating pulses of $HfCl_4$ and an oxygen source, such as $H_2/CO_2$ with a substrate temperature of above 650° C. Other oxygen sources include $O_2$, $O_2/H_2$, $H_2/CO_2$, $O_3$, NO, $NO_2$, $N_2O$, and $H_2O_2$. The $HfO_2$ can be crystalline as deposited. The dielectric constant of the resulting crystalline hafnium oxide is higher than the dielectric constant of amorphous or weakly crystalline hafnium oxide.

EXAMPLE 5

Crystalline layers of $ZrO_2$ are deposited on a substrate by ALD using alternating pulses of $ZrCl_4$ and an oxygen source, such as $H_2/CO_2$ with a substrate temperature of above 650° C.

Other oxygen sources include $O_2$, $O_2/H_2$, $H_2/CO_2$, $H_2O$, $O_3$, NO, $NO_2$, $N_2O$, and $H_2O_2$. The dielectric constant of the resulting crystalline zirconium oxide is higher than the dielectric constant of amorphous zirconium oxide or less crystalline zirconium oxide.

EXAMPLE 6

Layers of $HfO_2$ and $Al_2O_3$ are deposited on a substrate by ALD from $HfCl_4$ and an oxidizing agent and $AlCl_3$ and an oxidizing agent with a substrate temperature of above 650° C. The composition is controlled by varying the number of cycles of $HfO_2$ and $Al_2O_3$. The oxidizing agent can be one or more of $O_2$, $O_2/H_2$, $H_2/CO_2$, $H_2O$, $O_3$, NO, $NO_2$, $N_2O$, and $H_2O_2$.

EXAMPLE 7

A memory capacitor is formed with a crystalline dielectric layer. First a platinum bottom electrode is deposited. Next, a crystalline $HfO_2$ dielectric layer is deposited on top of the bottom electrode by ALD. The crystalline dielectric layer is deposited by alternating and sequential pulses of $HfCl_4$ and $H_2/CO_2$ with a temperature of above 650° C. A top electrode is then deposited on top of the hafnium oxide layer.

EXAMPLE 8

A transistor is formed on a substrate surface. First multiple conductive gate electrodes are formed on a surface of a substrate. Next, an $Al_2O_3$ dielectric oxide layer is deposited on the gate electrodes by an ALD process. The dielectric oxide layer is deposited by alternate and sequential pulses of $AlCl_3$ and $H_2/CO_2$ with a substrate temperature of above 650° C. The aluminum oxide is crystalline as deposited. Next, a semiconductor layer comprising silicon is deposited on top of the aluminum oxide layer. Next, source and drain electrodes are deposited on top of the semiconductor layer in alignment with the gate electrodes.

It will be appreciated by those skilled in the art that various modifications and changes can be made without departing from the scope of the invention. Similar other modifications and changes are intended to fall within the scope of the invention, as defined by the appended claims.

We claim:
1. A method for forming a metal oxide thin film on a substrate in a reaction chamber by atomic layer deposition, the method comprising a first metal oxide deposition cycle comprising:
   providing a vapor phase pulse of a first reactant comprising a first metal precursor to the reaction chamber such that it forms no more than a monolayer on the substrate;
   removing excess first reactant from the reaction chamber;
   providing a vapor phase pulse comprising both hydrogen and carbon dioxide to the reaction chamber; and
   removing excess second reactant and any reaction byproducts from the reaction chamber;
   wherein the providing and removing steps are repeated until a thin metal oxide film of a desired thickness and composition is obtained, wherein the substrate temperature during the providing and removing steps is above about 600° C.

2. The method of claim 1, wherein the thin film is crystalline as deposited.
3. The method of claim 1, wherein the metal halide precursor comprises one or more of aluminum, silicon, hafnium, titanium, and zirconium.
4. The method of claim 1, wherein the metal precursor comprises a metal halide.
5. The method of claim 4, wherein the metal halide precursor comprises one of $AlCl_3$, $SiF_4$, $SiCl_4$, $HfCl_4$, $HfCl_4$, $TiCl_4$, and $ZrCl_4$.
6. The method of claim 3, wherein the deposited thin film comprises $TiO_2$.
7. The method of claim 1, wherein the substrate temperature during the providing and removing steps is above about 1000° C.
8. The method of claim 2, with the proviso that the crystalline thin film is deposited without an annealing step.
9. The method of claim 1, further comprising a second metal oxide deposition cycle, comprising:
   providing a vapor phase reactant pulse comprising a second metal precursor to the reaction chamber;
   removing excess reactant from the reaction chamber, if any;
   providing a vapor phase reactant pulse comprising an oxygen precursor to the reaction chamber such that the oxygen precursor reacts with the metal precursor on the substrate; and
   removing excess reactant and any reaction byproducts from the reaction chamber;
   wherein the first and second metal deposition cycles are repeated until a thin film of the desired composition and thickness is formed.
10. The method of claim 9, wherein the first and second metal precursors comprises one or more of aluminum, silicon, hafnium, titanium, and zirconium.
11. The method of claim 10, wherein the first metal precursor comprises aluminum, wherein the second metal precursor comprises hafnium, thereby forming a thin film comprising aluminum, hafnium, and oxygen.
12. A method for forming a thin film comprising titanium dioxide by atomic layer deposition on a substrate in a reaction space comprising:
   alternately and sequentially providing a vapor phase reactant pulse comprising a titanium precursor and a vapor phase reactant pulse comprising an oxygen precursor to the substrate in the reaction space;
   wherein the alternate and sequential pulses are repeated until a thin film of a desired thickness is obtained, wherein the substrate temperature during the pulses is above about 1000° C.
13. The method of claim 12, wherein the titanium precursor comprises $TiCl_4$.
14. The method of claim 12, wherein the oxygen precursor comprises one or more of $O_2$, $O_2$ and $H_2$, $H_2$ and $CO_2$, $H_2O$, $O_3$, NO, $NO_2$, $N_2O$, and $H_2O_2$.
15. The method of claim 12, wherein the titanium dioxide thin film is crystalline as deposited.
16. The method of claim 15, wherein the thin film is an anatase crystalline thin film as deposited.
17. The method of claim 15, wherein the thin film has an optical transmittance of greater than about 60% in the visible region.

* * * * *